(12) United States Patent
Chae et al.

(10) Patent No.: US 11,508,704 B2
(45) Date of Patent: Nov. 22, 2022

(54) METHOD OF REPAIRING LIGHT EMITTING DEVICE AND DISPLAY PANEL HAVING REPAIRED LIGHT EMITTING DEVICE

(71) Applicant: SEOUL VIOSYS CO., LTD., Ansan-si (KR)

(72) Inventors: Jong Hyeon Chae, Ansan-si (KR); Ik Kyu You, Ansan-si (KR); Seom Geun Lee, Ansan-si (KR); Seong Kyu Jang, Ansan-si (KR); Yong Woo Ryu, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 3 days.

(21) Appl. No.: 17/121,651

(22) Filed: Dec. 14, 2020

(65) Prior Publication Data
US 2021/0183828 A1  Jun. 17, 2021

Related U.S. Application Data

(60) Provisional application No. 62/991,189, filed on Mar. 18, 2020, provisional application No. 62/949,096, filed on Dec. 17, 2019.

(51) Int. Cl.
*H01L 25/075* (2006.01)
*H01L 33/62* (2010.01)
*H01L 23/00* (2006.01)

(52) U.S. Cl.
CPC .......... *H01L 25/0753* (2013.01); *H01L 24/16* (2013.01); *H01L 33/62* (2013.01);
(Continued)

(58) Field of Classification Search
CPC ..... H01L 25/0753; H01L 25/075–0753; H01L 25/048; H01L 25/13; H01L 25/18;
(Continued)

(56) References Cited

U.S. PATENT DOCUMENTS 4,857,801 A * 8/1989 Farrell ..................... G09F 9/33
257/89
8,230,690 B1 * 7/2012 Salessi ................... H05B 45/30
165/185

(Continued)

FOREIGN PATENT DOCUMENTS

KR  10-2019-0018385  2/2019
KR  10-2019-0102382  9/2019

OTHER PUBLICATIONS

International Search Report dated Apr. 16, 2021 issued in PCT/KR2020/018430 (with English Translation.

*Primary Examiner* — Lawrence C Tynes, Jr.
(74) *Attorney, Agent, or Firm* — H.C. Park & Associates, PLC

(57) ABSTRACT

A display panel including a circuit board having first pads, a plurality of light emitting devices disposed on the circuit board and having second pads, at least one of the light emitting devices including a repaired light emitting device, and a metal bonding layer bonding the first pads and the second pads, in which the metal bonding layer of the repaired light emitting device has at least one of a thickness and a composition different from that of the metal bonding layer of the remaining light emitting devices.

18 Claims, 11 Drawing Sheets

(52) U.S. Cl.
CPC ............... *H01L 2224/16227* (2013.01); *H01L 2224/16505* (2013.01)

(58) Field of Classification Search
CPC ......... H01L 24/95; H01L 24/16; H01L 24/81; H01L 24/05; H01L 24/13; H01L 2224/16227; H01L 2224/81193; H01L 2224/81191; H01L 2224/0401; H01L 2224/81192; H01L 33/62
See application file for complete search history.

(56) References Cited

U.S. PATENT DOCUMENTS

| | | | | |
|---|---|---|---|---|
| 8,349,116 B1* | 1/2013 | Bibi | ............... | B32B 38/18 156/273.1 |
| 8,803,337 B1* | 8/2014 | Lin | ............... | H01L 24/13 257/781 |
| 8,941,238 B2* | 1/2015 | Aoi | ............... | H01L 24/16 257/738 |
| 10,325,894 B1* | 6/2019 | Pan | ............... | H01L 25/167 |
| 10,854,801 B1* | 12/2020 | Henry | ............... | H01L 25/0753 |
| 11,244,917 B2* | 2/2022 | Jadhav | ............... | H01L 24/11 |
| 2004/0209406 A1* | 10/2004 | Jan | ............... | H01L 24/13 438/148 |
| 2010/0103802 A1* | 4/2010 | Tateyanagi | ............ | G11B 7/1275 369/112.28 |
| 2013/0026511 A1* | 1/2013 | Yeh | ............... | H01L 33/54 257/89 |
| 2015/0179945 A1* | 6/2015 | Chien | ............... | H01L 27/3211 438/35 |
| 2016/0141278 A1* | 5/2016 | Lai | ............... | H01L 24/05 257/13 |
| 2017/0062650 A1* | 3/2017 | Chen | ............... | H01L 24/29 |
| 2017/0142874 A1* | 5/2017 | Pourchet | ............... | H01L 21/6836 |
| 2017/0263811 A1 | 9/2017 | Zou et al. | | |
| 2017/0373046 A1* | 12/2017 | Gardner | ............... | H01L 21/6835 |
| 2018/0175262 A1* | 6/2018 | Jansen | ............... | H01L 25/167 |
| 2018/0218998 A1* | 8/2018 | Uzoh | ............... | H01L 24/83 |
| 2019/0081200 A1 | 3/2019 | Ting et al. | | |
| 2019/0131282 A1* | 5/2019 | Liu | ............... | H01L 24/81 |
| 2019/0131344 A1* | 5/2019 | Li | ............... | H01L 33/62 |
| 2019/0181122 A1 | 6/2019 | Hsu et al. | | |
| 2019/0393069 A1* | 12/2019 | Paranjpe | ............ | H01L 33/0095 |
| 2020/0035653 A1* | 1/2020 | Chong | ............... | H01L 33/005 |
| 2021/0136966 A1 | 5/2021 | Jang et al. | | |

\* cited by examiner

METHOD OF REPAIRING LIGHT EMITTING DEVICE AND DISPLAY PANEL HAVING REPAIRED LIGHT EMITTING DEVICE

CROSS-REFERENCE TO RELATED APPLICATIONS

This application claims priority from and the benefit of U.S. Provisional Application No. 62/949,096, filed on Dec. 17, 2019, and U.S. Provisional Application No. 62/991,189, filed on Mar. 18, 2020, each of which is hereby incorporated by reference for all purposes as if fully set forth herein.

BACKGROUND

Field

Exemplary embodiments of the invention relate generally to a method of repairing light emitting devices, a display panel having the repaired light emitting device, and a display apparatus having the same, and more particularly, a method of repairing micro LEDs.

Discussion of the Background

As an inorganic light source, light emitting diodes have been used in various fields including displays, vehicular lamps, general lighting, and the like. With various advantages of light emitting diodes over existing light sources, such as longer lifespan, lower power consumption, and rapid response, light emitting diodes have been replacing existing light sources.

Light emitting diodes have been generally used as backlight light sources in display apparatuses. However, recently, small-sized light emitting diodes have been developed, which allows LED display apparatuses employing the small-sized light emitting diodes to directly display an image using micro LEDs.

In general, a display apparatus realizes various colors through mixture of blue, green, and red light. In order to display various images, the display apparatus include a plurality of pixels each including sub-pixels corresponding to blue, green, and red light, respectively. In this manner, a color of a certain pixel is determined based on the colors of the sub-pixels so that images can be displayed through combination of such pixels.

LEDs can emit light of various colors depending on their materials. As such, a display apparatus may be provided by employing individual micro LEDs emitting blue, green, and red arranged on a two-dimensional plane, or by employing micro LEDs having a stacked structure, in which a blue LED, a green LED, and a red LED are stacked one above another on a two-dimensional plane.

Micro LEDs used in one display apparatus usually require more than one million even for a small-sized display. Due to the small size of micro LEDs and the enormous number required, mass production of micro LED display apparatus with a conventional technology is almost impossible because a conventional die bonding technology mounts LED chips individually. Accordingly, a technology for transferring a plurality of micro LEDs onto a circuit board in a group has been recently developed.

Some of the micro LEDs transferred in a group may exhibit poor bonding or poor luminescence characteristics, and these defective micro LEDs need to be repaired. In general, repairment of micro LEDs includes replacing defective micro LEDs with normal micro LEDs. However, repairment of micro LEDs is difficult as the micro LEDs cannot be individually picked up and mounted due to the small size of the micro LEDs.

The above information disclosed in this Background section is only for understanding of the background of the inventive concepts, and, therefore, it may contain information that does not constitute prior art.

SUMMARY

Methods according to exemplary embodiments of the invention are capable of repairing a light emitting device for a display, particularly micro LEDs.

Additional features of the inventive concepts will be set forth in the description which follows, and in part will be apparent from the description, or may be learned by practice of the inventive concepts.

A display panel according to an exemplary embodiment includes a circuit board having first pads, a plurality of light emitting devices disposed on the circuit board and having second pads, at least one of the light emitting devices including a repaired light emitting device, and a metal bonding layer bonding the first pads and the second pads, in which the metal bonding layer of the repaired light emitting device has at least one of a thickness and a composition different from that of the metal bonding layer of the remaining light emitting devices.

An upper surface of the repaired light emitting device may be disposed at a higher elevation than those of the remaining light emitting devices.

The metal bonding layer may include at least one of AuSn, CuSn, and In.

Each of the light emitting devices may be configured to emit at least one of blue light, green light, and red light.

Each of the light emitting devices may be configured to emit each of blue light, green light, and red light.

A method of repairing a light emitting device according to another exemplary embodiment includes removing a defective light emitting device among a plurality of light emitting devices mounted on a circuit board, forming a replacement light emitting device on a substrate, forming a bonding material layer on the replacement light emitting device, and bonding the replacement light emitting device to a location of the circuit board from which the defective light emitting device is removed using the bonding material layer.

The bonding material layer may include In.

Mounting the light emitting devices onto the circuit board may include forming bonding material layers on first pads of the circuit board, disposing the light emitting devices on the bonding material layers, and forming metal bonding layers by applying heat to the bonding material layers.

The metal bonding layer of the defective light emitting device may be removed together with the defective light emitting device, while the corresponding the first pads are retained on the circuit board such that the replacement light emitting device is bonded thereto.

A plurality of replacement light emitting devices may be formed on the substrate, bonding material layers may be respectively formed on the replacement light emitting devices, a portion of the replacement light emitting devices may be transferred onto a temporary substrate, the replacement light emitting devices on the temporary substrate may be transferred onto a carrier substrate, and the replacement light emitting devices on the carrier substrate may be bonded together using the bonding material layers at locations of the circuit board from which the defective light emitting devices are removed.

The replacement light emitting devices on the temporary substrate may be disposed to correspond to the locations of the circuit board from which the defective light emitting devices are removed.

The carrier substrate may include an adhesive tape, and the replacement light emitting devices may be transferred to the adhesive tape.

A single replacement light emitting device may be formed on the substrate, and the replacement light emitting device on the substrate may be bonded to the location of the circuit board from which the defective light emitting device is removed.

A plurality of defective light emitting devices on the circuit board may be repaired using a plurality of substrates each including the single replacement light emitting device, respectively.

The method may further include forming barrier metal layers on the first pads before forming the bonding material layers on the first pads.

The barrier metal layer of the defective light emitting device may be removed together with the metal bonding layer of the defective light emitting device.

The barrier metal layer may include a lower barrier metal layer and an upper barrier metal layer.

The upper barrier metal layer of the defective light emitting device may be removed together with the metal bonding layer of the defective light emitting device, while the lower barrier metal layer of the defective light emitting device is retained on the circuit board.

A display panel according to further exemplary embodiment includes a circuit board having first pads, a plurality of first light emitting devices disposed on the circuit board, a first metal bonding layer bonding the first light emitting device to the first pad, a first lower barrier layer disposed between the first metal bonding layer and the first pad, and a lower metal layer disposed between the first lower barrier layer and the first metal bonding layer, in which the first metal bonding layer includes an alloy, and the lower metal layer includes a metal layer having a different component from the first metal bonding layer.

The first metal bonding layer may include Au and In, and the lower metal layer may include Au.

The lower metal layer may contact the first lower barrier layer.

The display panel may further include an upper barrier layer disposed between the first metal bonding layer and the lower metal layer.

The upper barrier layer may contact the first metal bonding layer and the lower metal layer.

The first light emitting device may include second pads, the display panel may further include a third barrier layer disposed on the second pad, and the first metal bonding layer may be disposed between the lower metal layer and the third barrier layer.

The display panel may further include at least one second light emitting device disposed on the circuit board, and a second metal bonding layer bonding the second light emitting device to the first pad, in which the second metal bonding layer may include a metallic element of the lower metal layer.

The display panel may further include a second lower barrier layer disposed between the second metal bonding layer and the first pad, in which the second lower barrier layer may contact the first pad and the second metal bonding layer.

The display panel may further include an upper barrier layer disposed between the first metal bonding layer and the lower metal layer, in which the upper barrier layer may contact the first metal bonding layer.

The second metal bonding layer may be thicker than the first metal bonding layer.

An upper surface of the second light emitting device may be disposed at a higher elevation than that of the first light emitting device.

The first and second light emitting devices may be configured to emit at least one of blue light, green light, and red light, respectively.

The first and second light emitting devices may be configured to emit each of blue light, green light, and red light, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
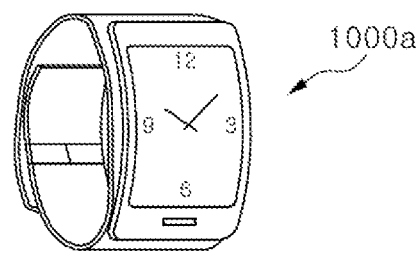
FIG. 1 shows schematic perspective views illustrating display apparatuses according to exemplary embodiments of the invention.
Figure 1:
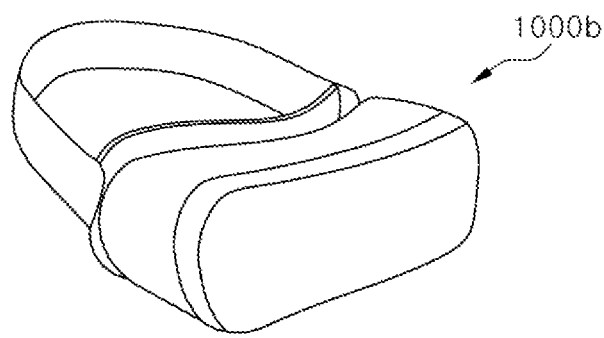
Figure 1:
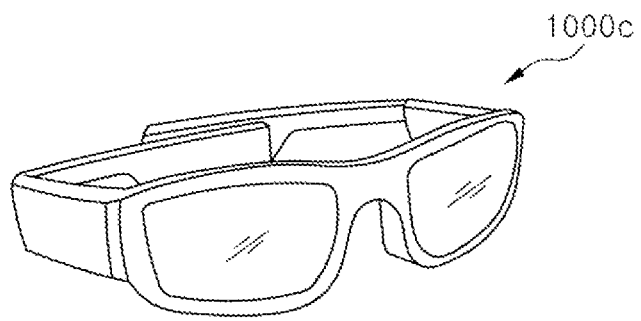

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 shows schematic perspective views illustrating display apparatuses according to exemplary embodiments.

The light emitting device according to exemplary embodiments may be used in a VR display apparatus such as a smart watch 1000*a* or a VR headset 1000*b*, or an AR display apparatus such as augmented reality glasses 1000*c*. However, the inventive concept are not limited thereto.

A display panel for implementing an image is mounted on a display apparatus.

Figure 2:
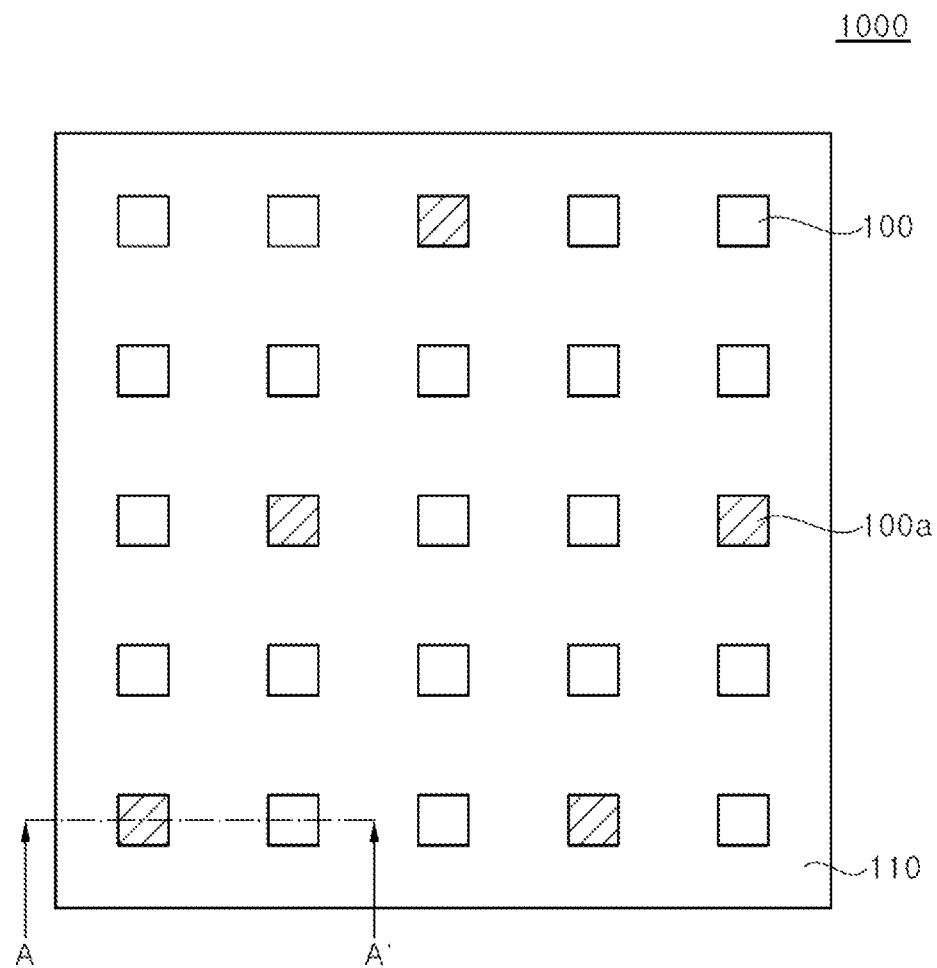
FIG. 2 is a schematic plan view of a display panel according to an exemplary embodiment of the invention.
Figure 3:
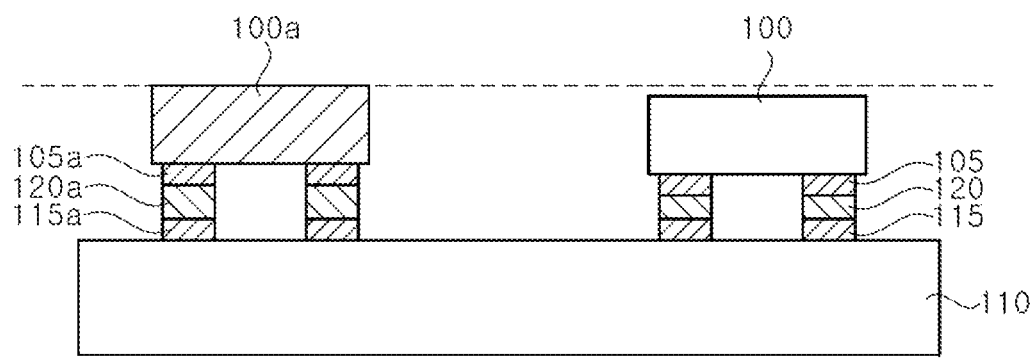
FIG. 3 is a schematic partial cross-sectional view taken along line A-A' of a display panel of FIG. 2 according to an exemplary embodiment of the invention.

FIG. 2 is a schematic plan view of a display panel 1000 according to an exemplary embodiment, and FIG. 3 is a schematic partial cross-sectional view taken along line A-A' of FIG. 2.

Referring to FIGS. 2 and 3, the display panel 1000 according to an exemplary embodiment includes a circuit board 110 and light emitting devices 100 and 100*a*. As used herein, the light emitting devices 100 and 100*a* may be small-sized LEDs, commonly referred to as micro LEDs. For example, the light emitting device 100 may have a size smaller than 500 μm×500 μm, and further, smaller than 100 μm×100 μm. However, the inventive concepts are not limited to a particular size of the light emitting device 100.

The circuit board 110 may include a circuit for passive matrix driving or active matrix driving. In an exemplary embodiment, the circuit board 110 may include interconnection lines and resistors therein. In another exemplary embodiment, the circuit board 110 may include interconnection lines, transistors, and capacitors. The circuit board 110 may also have pads 115 disposed on an upper surface thereof to allow electrical connection to the circuit therein.

A plurality of light emitting devices 100 and 100*a* is arranged on the circuit board 110. The light emitting device 100 may refer to a light emitting device of good performance mounted on the circuit board 110 by group transfer, and the light emitting device 100*a* may refer to a repaired light emitting device. The repaired light emitting device 100*a* may be substantially the same structure as that of the light emitting device 100, but the inventive concepts are not limited thereto. An interval between the light emitting devices 100 and 100*a* may be at least greater than a width of a light emitting device 100.

In an exemplary embodiment, the light emitting devices 100 and 100*a* may be sub-pixels that emit light of a specific color, and these sub-pixels may form one pixel. For example, a blue LED, a green LED, and a red LED may be disposed adjacent to one another to form one pixel. However, the inventive concepts are not limited thereto, and each of the light emitting devices 100 and 100*a* may have a stacked structure emitting light of various colors. For example, each of the light emitting devices 100 and 100*a* may have a structure, in which a blue LED, a green LED, and a red LED are stacked to overlap one another, and thus, one light emitting device 100 may form one pixel.

The light emitting device 100 may have pads 105, and the pads 105 may be adhered to corresponding pads 115 of the circuit board 110 through a bonding layer 120. The bonding layer 120 may include, for example, a bonding material, such as AuSn, CuSn, In, or the like.

The light emitting device 100*a* may have pads 105*a*, and the pads 105*a* may be adhered to corresponding pads 115*a* of the circuit board 110 through a bonding layer 120*a*. The pads 105*a* may be formed of the same material as the pads 105, and may have substantially the same layer structure, but the inventive concepts are not limited thereto. In some exemplary embodiments, the pads 105 and 105*a* may be formed of different materials from each other, and/or may have different layer structures from each other. In addition, the pads 115*a* may be formed of substantially the same material as the pads 115 to have substantially the same layer structure, but the inventive concepts are not limited thereto. For example, the material and structure of the pad 115*a* may be modified from those of the pad 115. This will be described in more detail later.

In an exemplary embodiment, an upper surface of the light emitting device 100*a* may be placed higher than that of the light emitting device 100. In particular, the bonding layer 120*a* may be thicker than the bonding layer 120, or the pad 105*a* may be thicker than the pad 105. Furthermore, a composition of the bonding layer 120*a* may be different from that of the bonding layer 120. For example, Ni content of the bonding layer 120 may be higher than that of the bonding layer 120*a*. Furthermore, Au content of the bonding layer 120 may be higher than that of the bonding layer 120*a*. In addition, In content of the bonding layer 120*a* may be higher than that of the bonding layer 120.

The display panel 1000 may include at least one light emitting device 100*a*, and the light emitting device 100*a* may be distinguished from the light emitting device 100 by the structure or composition of the bonding layer 120*a*, or by an elevation of the upper surface of the light emitting device 100*a*.

FIGS. 4A, 4B, 4C, and 4D are schematic cross-sectional views illustrating a process of repairing a micro LED according to exemplary embodiments.

Figure 4A:
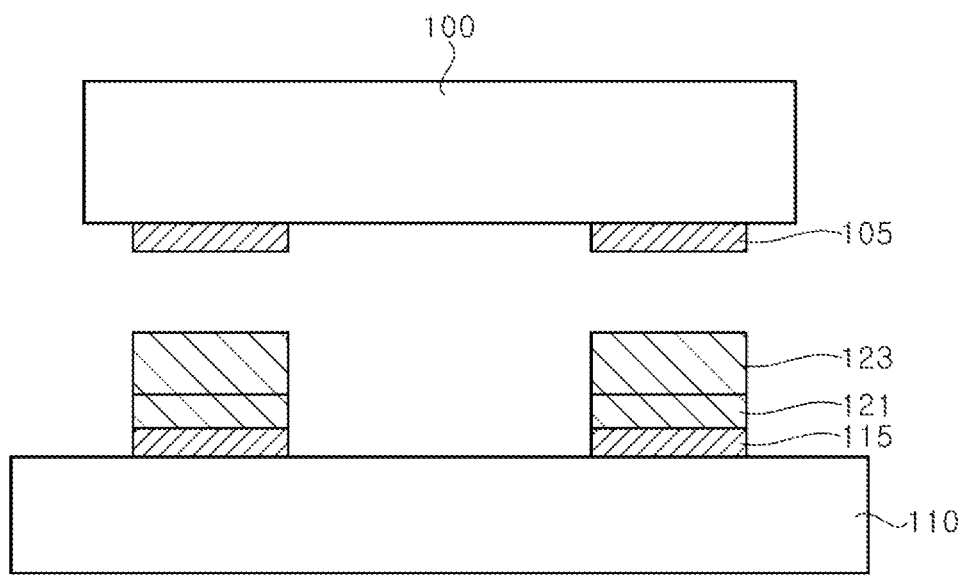
FIGS. 4A, 4B, 4C, and 4D are schematic cross-sectional views illustrating a process of repairing a micro LED according to exemplary embodiments of the invention.

Referring to FIG. 4A, a circuit board 110 includes pads 115. The pads 115 are connected to circuits in the circuit board 110 and provide contact points for connecting a light emitting device 100 to the circuits. The pads 115 are disposed in each region of the circuit board 110 where the light emitting devices 100 are to be mounted, such that a plurality of light emitting devices 100 may be mounted on the circuit board 110. The pads 115 may be formed of a metal layer including Au. For example, the pads 115 may have a multilayer structure of Cu/Ni/Au.

Barrier layers 121 are provided on the pads 115 and bonding material layers 123 are provided on the barrier layers 121. The barrier layers 121 may prevent the bonding material layers 123 from diffusing into the pads 115, thereby preventing damage to the pads 115. The barrier layer 121 may be a metal layer mixed with the bonding material layer 123, or may be a metal layer for blocking diffusion of the bonding material layer 123. The barrier layer 121 according to an exemplary embodiment may include at least one metal selected from Ni, Cr, Ti, Ta, Mo, and W. For example, the barrier layer 121 may have a multilayer structure of Cr/Ni or Ti/Ni.

The bonding material layer 123 may include AuSn, CuSn, or In. In general, the bonding material layers 123 are provided on the pads 115 for group transfer using micro LED technology.

In some exemplary embodiments, a metal layer mixed with the bonding material layer 123, such as an Au layer, may be interposed between the barrier layer 121 and the bonding material layer 123.

The light emitting device 100 includes pads 105. The pads 105 correspond to the pads 115 of the circuit board 110. As shown in the drawing, the pads 105 may be bump pads protruding from the light emitting device 100, but do not necessarily have a protruding shape. The plurality of light emitting devices 100 may then be placed to correspond to the pads 115 of the circuit board 110.

Figure 4B:
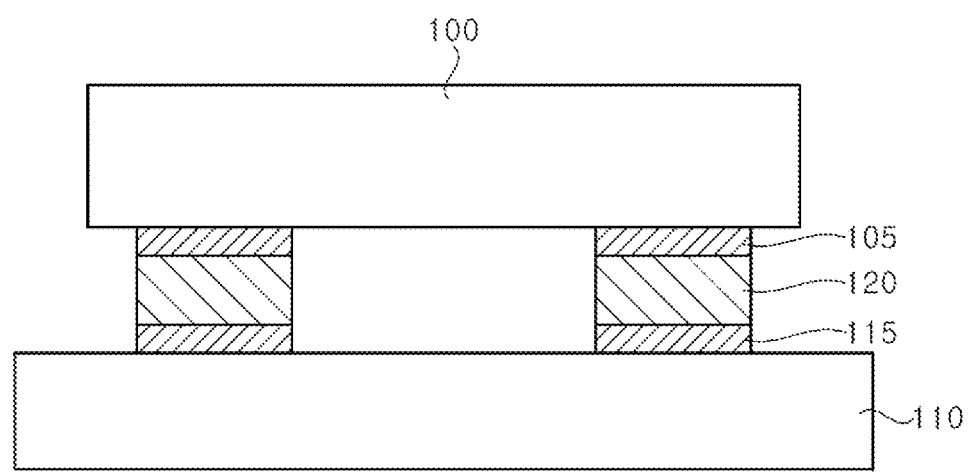

Referring to FIG. 4B, after the pads 105 of the light emitting device 100 are arranged on the bonding material layers 123 shown in FIG. 4A, a bonding layer 120 is formed by applying heat at a bonding temperature. The barrier layer 121 and the bonding material layer 123 may be mixed with each other, and at least a portion of the pads 105 may be mixed with the bonding material layer 123. In this manner, the light emitting device 100 may be stably attached to the circuit board 110 by the bonding layer 120.

Figure 4C:
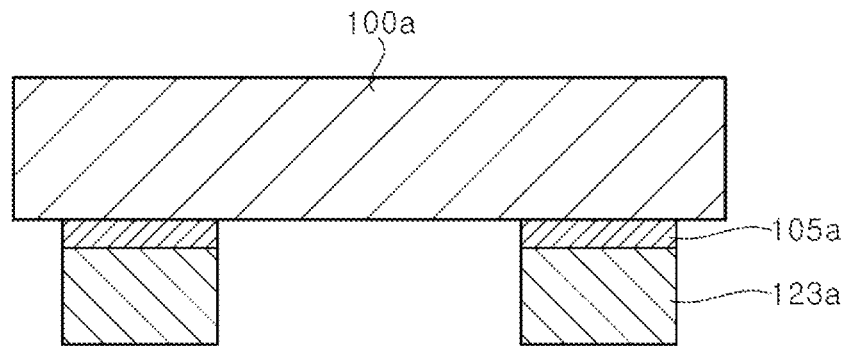
Figure 4C:
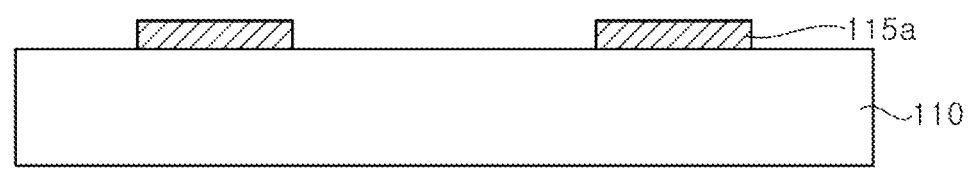

Referring to FIG. 4C, as described with reference to FIG. 4B, after the light emitting device 100 is bonded to the circuit board 110, a defect in the light emitting device 100 may be detected. The defect in the light emitting device 100 may be caused by, for example, defective bonding, or by a failure in performance of the light emitting device 100.

In this case, the defective light emitting devices 100 are removed from the circuit board 110. After the light emitting devices 100 are removed, the remaining bonding layers 120 and all of the barrier layers 121 may also be removed. The bonding layers 120 and the barrier layers 121 may be removed using a laser, for example. Accordingly, pads 115*a* may be retained on the circuit board 110 after the light emitting devices 100 are removed. The pads 115*a* may be the same as the pads 115 before bonding the light emitting devices 100. In some exemplary embodiments, the pads 115*a* may be modified from the pads 115. For example, the pads 115*a* may include a metallic material for the bonding material layer 123.

Light emitting devices 100*a* for repairing are provided on the pads 115*a*. The light emitting devices 100*a* for repairing replace the defective light emitting devices 100, and may have performance required as the light emitting devices 100. Further, the light emitting device 100*a* may have substantially the same structure as a general structure of the light emitting device 100, but the inventive concepts are not limited thereto.

The light emitting device 100*a* may have pads 105*a*. The pads 105*a* may have the same material and layer structure as those of the pads 105 described above, but the inventive concepts are not limited thereto.

Bonding material layers 123*a* are provided on the pads 105*a*. The bonding material layer 123*a* may include a bonding material, such as AuSn, CuSn, or In. In an exemplary embodiment, the bonding material layer 123*a* has a melting point equal to or lower than that of the bonding material layer 123 described above. In this manner, the light emitting device 100*a* for repairing may be bonded without affecting other light emitting devices 100, due to low melting point of the bonding material layer 123*a*.

Figure 4D:
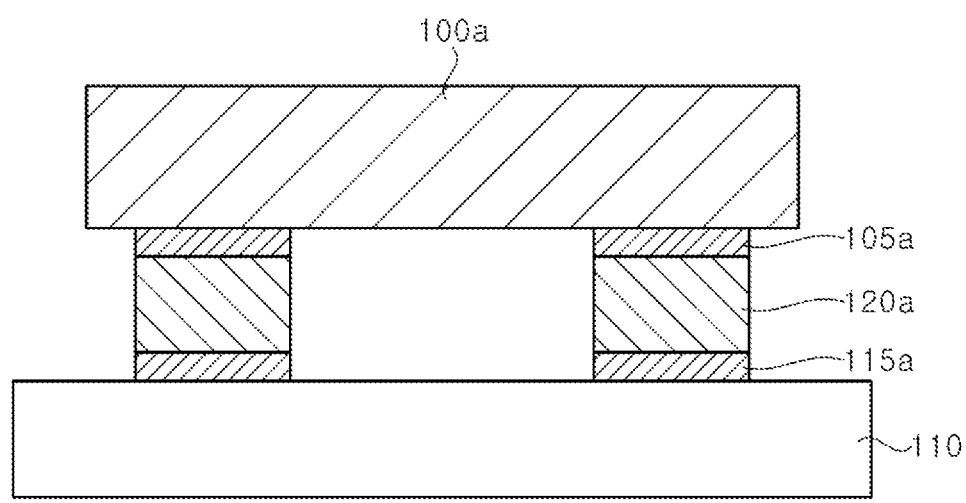

Referring to FIG. 4D, after the bonding material layers 123*a* are arranged on the corresponding pads 115*a*, bonding layers 120*a* are formed by applying heat at a bonding temperature. In this manner, the light emitting device 100*a* is bonded to the circuit board 110 by the bonding layer 120*a*. The bonding layer 120*a* may have the same composition as that of the bonding layer 120, but may have composition different from that of the bonding layer 120 in other exemplary embodiments.

In the illustrated exemplary embodiment, the bonding material layers 123*a* are provided on the pads 105*a* of the light emitting device 100*a* to mount the light emitting device 100*a* on the circuit board 110 for repairing. When the light emitting device 100 includes a micro LED which has a small size, forming the bonding material layers 123*a* on the pads 115*a* of the circuit board 110 generally becomes very difficult due to their small form factor. However, since the bonding material layers 123*a* are provided on the pads 105*a* of the light emitting device 100*a* in the illustrated exemplary embodiment, forming the bonding material layers 123*a* may become easier, and thus, the light emitting device 100*a* may be easily mounted in a region where the defective light emitting device 100 is removed for repairing.

Hereinafter, a method of repairing a micro LED according to exemplary embodiments will be described in detail.

FIGS. 5A, 5B, 5C, 5D, and 5E are schematic cross-sectional views illustrating a method of repairing a micro LED according to an exemplary embodiment.

Figure 5A:
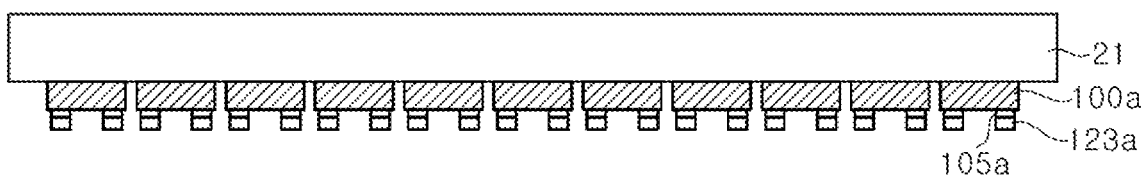
FIGS. 5A, 5B, 5C, 5D, and 5E are schematic cross-sectional views illustrating a method of repairing a micro LED according to an exemplary embodiment of the invention.

Referring to FIG. 5A, light emitting devices 100*a* for repairing may be arranged on a substrate 21. The substrate 21 may be a growth substrate capable of growing an epitaxial layer thereon. For example, the substrate 21 may be a sapphire substrate, a silicon substrate, or a GaAs substrate.

The light emitting devices 100*a* may be manufactured using epitaxial layers grown on the substrate 21, and may include first conductivity type semiconductor layers, active layers, and second conductivity type semiconductor layers. Furthermore, the light emitting devices 100*a* according to an exemplary embodiment may have a structure in which a plurality of LEDs is stacked.

Each of the light emitting devices 100*a* has pads 105*a*, and bonding material layers 123*a* are provided on the pads 105*a*. For example, the bonding material layers 123*a* may be provided by individually doping the bonding material layers 123*a* on the pads 105*a*, or the bonding material layers 123*a* may be formed on the pads 105*a* at once by dipping the pads 105*a* in a molten bonding material.

Figure 5B:
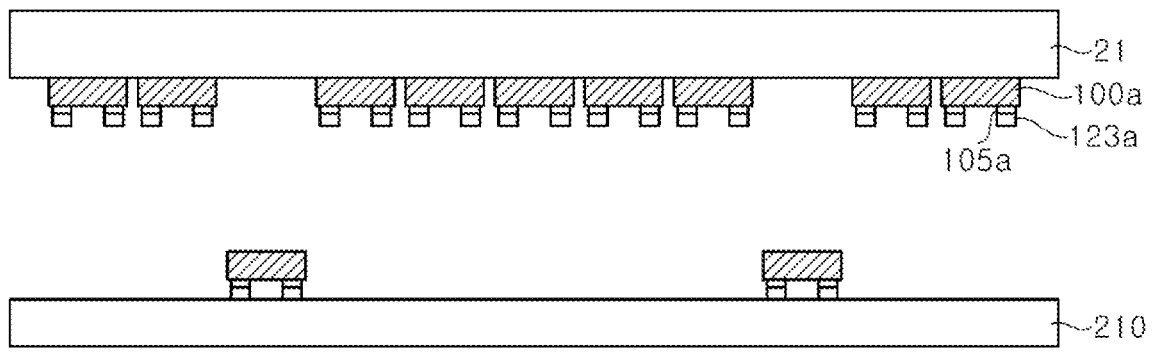

Referring to FIG. 5B, the light emitting devices 100*a* for repairing are transferred onto a temporary substrate 210. The temporary substrate 210 may be a tape, for example. After light emitting devices 100 are transferred to the circuit board 110 in a group, the light emitting devices 100 are inspected to detect defective light emitting devices 100. The light emitting devices 100*a* for repairing are transferred onto the temporary substrate 210 to correspond to locations of the defective light emitting devices 100. The light emitting devices 100*a* for repairing may be separated from the substrate 21 using a selective laser lift-off technique.

Figure 5C:
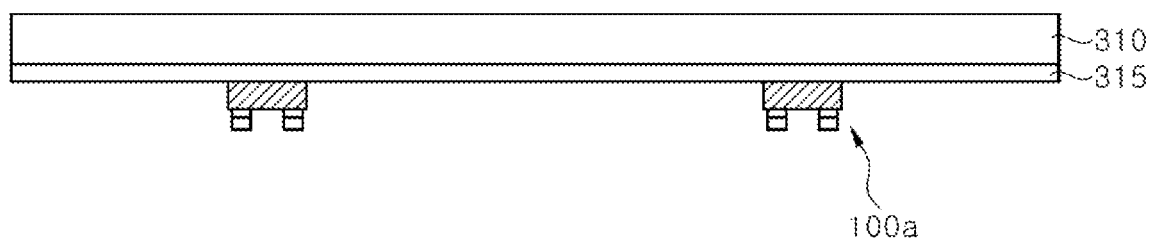

Referring to FIG. 5C, the light emitting devices 100*a* transferred onto the temporary substrate 210 are transferred again onto a carrier substrate 310. The carrier substrate 310 may have an adhesive layer 315, such as an adhesive tape, on a surface thereof. The adhesive layer 315 may also be formed of a material that may be easily modified.

The temporary substrate 210 is removed from the light emitting devices 100*a*, and thus, the bonding material layers 123*a* may be disposed a side of the light emitting devices 100*a* facing away from the carrier substrate 310.

Figure 5D:
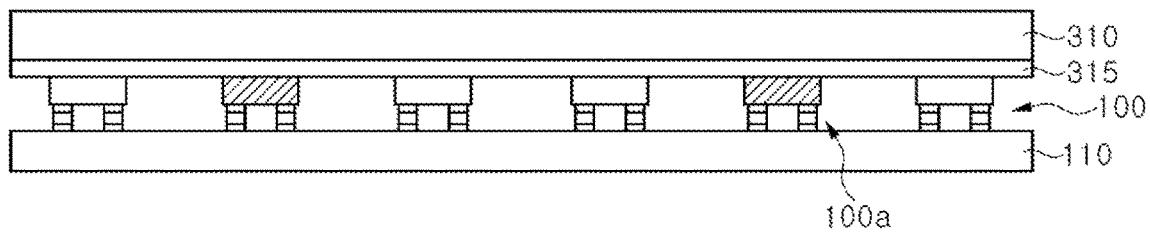

Referring to FIG. 5D, the circuit board 110 from which the defective light emitting devices 100 have been removed and the carrier substrate 310 are placed adjacently to each other, so that the light emitting devices 100*a* are disposed at corresponding locations on the circuit board 110. As described above with reference to FIG. 4C, after the defective light emitting devices 100 are removed, the bonding layers 120 may also be removed, and the pads 115*a* may be retained on the circuit board 110. In this case, all of barrier layers 121 formed on the pads 115 may also be removed.

The adhesive layer 315 on the carrier substrate 310 may be spaced apart from upper surfaces of the light emitting devices 100 mounted on the circuit board 110. However, the inventive concepts are not limited thereto, and in some exemplary embodiments, the adhesive layer 315 may contact the light emitting devices 100. Subsequently, by applying heat to the bonding material layers 123*a*, the light emitting devices 100*a* are bonded to the circuit board 110, as shown in FIGS. 4C and 4D.

Figure 5E:
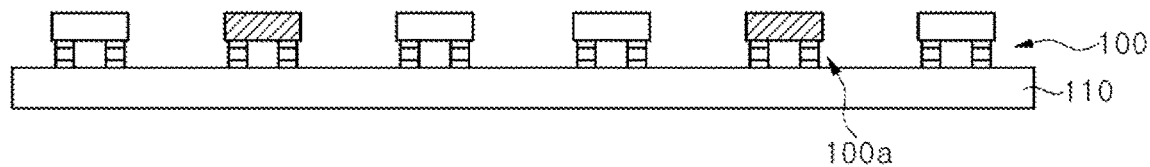

Referring to FIG. 5E, a display panel having the repaired light emitting devices 100*a* is provided by separating the carrier substrate 310 from the light emitting devices 100*a*. Upper surfaces of the light emitting devices 100*a* may be placed at substantially the same elevation as or slightly higher than the upper surfaces of the light emitting devices 100.

According to the illustrated exemplary embodiment, among the light emitting devices 100 disposed on the circuit board 110, the defective light emitting devices 100 may be replaced with the light emitting devices 100a for repairing through a single repairing process.

FIGS. 6A, 6B, 6C, 6D, and 6E are schematic cross-sectional views illustrating a process of repairing a micro LED according to another exemplary embodiment.

Figure 6A:
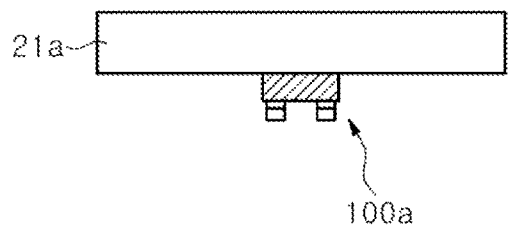
FIGS. 6A, 6B, 6C, 6D, and 6E are schematic cross-sectional views illustrating a process of repairing a micro LED according to another exemplary embodiment of the invention.

Referring to FIG. 6A, a light emitting device 100a for repairing is formed on a substrate 21a. In the illustrated exemplary embodiment, a single light emitting device 100a is provided on the substrate 21a. A plurality of substrates 21a each having single light emitting devices 100a may be provided. The substrate 21a may be a growth substrate for manufacturing the light emitting device 100a thereon. The substrate 21a has a larger width than the light emitting device 100a to facilitate handling of the light emitting device 100a.

As described above, the light emitting device 100a includes pads 105a, and bonding material layers 123a are provided on the pads 105a.

Figure 6B:
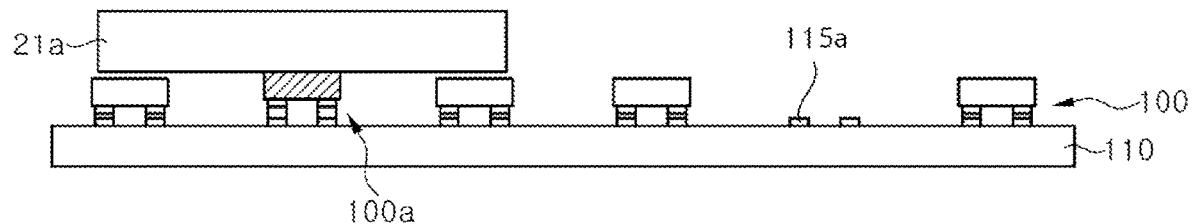

Referring to FIG. 6B, the light emitting device 100a is disposed and bonded on a circuit board 110 at a location where a defective light emitting device 100 has been removed. Handling of individual light emitting device 100a is difficult due to its small size, however, according to the illustrated exemplary embodiment, the light emitting device 100a may be easily handled as being mounted on the substrate 21a that is larger than the light emitting device 100a.

As described above, the defective light emitting device 100 and a bonding layer 120 thereon are removed from the circuit board 110. In this case, the pads 115a of the circuit board 110 may be retained on the circuit board 110. The bonding material layer 123a disposed on the light emitting device 100a for repairing is bonded to the pads 105a to form a bonding layer 120a. In this manner, the light emitting device 100a is bonded to the circuit board 110 by the bonding layer 120a.

Figure 6C:
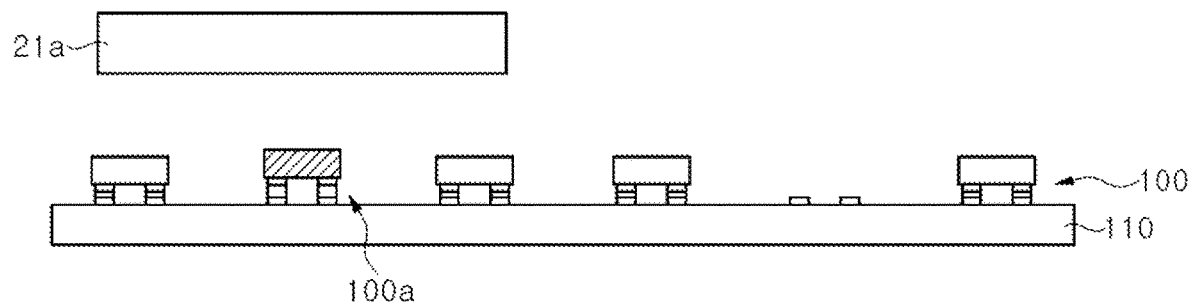

Referring to FIG. 6C, the substrate 21a is removed from the light emitting device 100a. The substrate 21a may be removed from the light emitting device 100a using, for example, a laser lift-off technique, a chemical etching technique, stress lift-off (SLO), or the like.

Figure 6D:
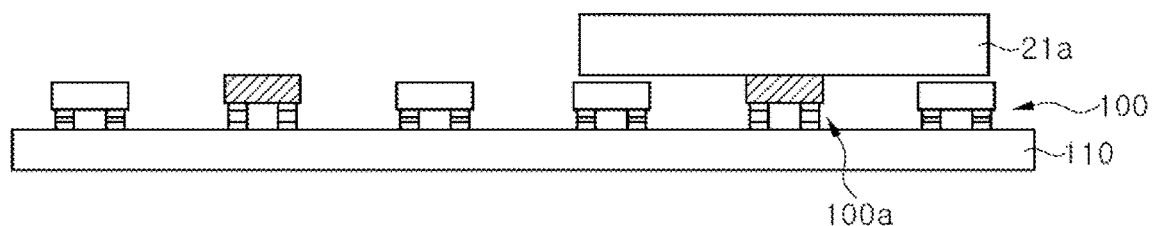
Figure 6E:
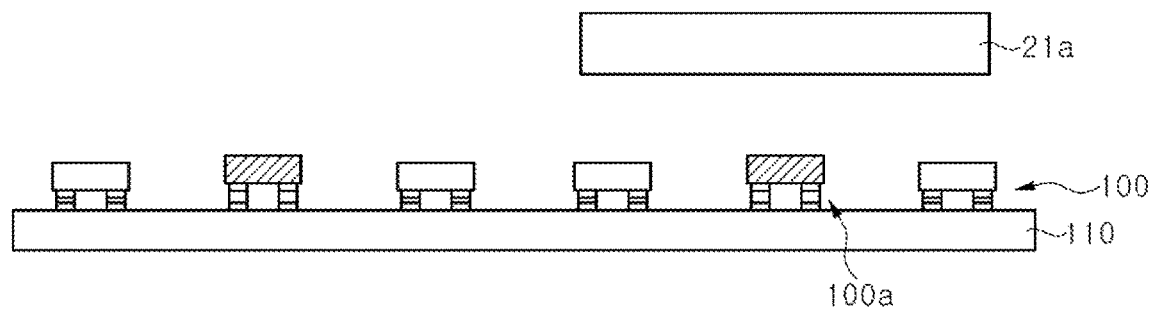

Referring to FIGS. 6D and 6E, subsequently, another light emitting device 100a for repairing is bonded to another location from which the defective light emitting device 100 has been removed using the substrate 21a. The substrate 21a is then removed from the light emitting device 100a. As such, each of the defective light emitting devices 100 on the circuit board 110 may be repaired by repeatedly performing the process of bonding the light emitting device 100a to the locations where the defective light emitting devices 100 have removed using a plurality of substrates 21a each having the light emitting device 100a for repairing.

In the illustrated exemplary embodiment, an upper surface of the light emitting device 100a for repairing mounted on the circuit board 110 may be placed at higher elevation than that of the light emitting device 100. As such, damage to the light emitting devices 100 already formed on the circuit board 110 by the substrate 21a may be prevented. However, the inventive concepts are not limited thereto, and elevations of upper surfaces of the light emitting devices 100 and 100a may be substantially the same.

Figure 7:
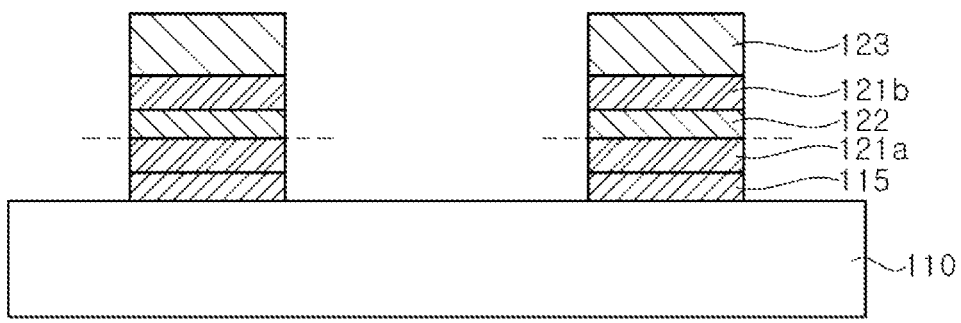
FIG. 7 is a schematic cross-sectional view illustrating a process of repairing a micro LED according to another exemplary embodiment of the invention.

FIG. 7 is a schematic cross-sectional view illustrating a process of repairing a micro LED according to another exemplary embodiment.

In the light emitting device 100 of FIG. 4A, a single barrier layer 121 is interposed between the pad 115 and the bonding material layer 123 on the circuit board 110. However, according to an exemplary embodiment, a plurality of barrier layers 121a and 121b are arranged on the circuit board 110.

More particularly, in the light emitting device according to the illustrated exemplary embodiment, a lower barrier layer 121a, an intermediate layer 122, and an upper barrier layer 121b may be interposed between a pad 115 and a bonding material layer 123. The lower barrier layer 121a and the upper barrier layer 121b may include Ni, Cr, Ti, Ta, Mo, or W. For example, the upper barrier layer 121b may include Ni that may be easily mixed with the bonding material layer 123, and the lower barrier layer 121a may include Cr, Ti, Ta, Mo, or W that blocks the bonding material layer 123. The intermediate layer 122 may be a metal layer that separates the lower barrier layer 121a and the upper barrier layer 121b, and may be, for example, an Au layer. In particular, the intermediate layer 122 may be a metal layer that can be easily mixed with the bonding material layer 123.

In some exemplary embodiments, a metal layer that can be easily mixed with the bonding material layer 123, such as an Au layer, may be additionally disposed on the upper barrier layer 121b.

When bonding the light emitting devices 100, pads 105 of the light emitting devices 100 are placed on the bonding material layer 123 to form a bonding layer 120. When the light emitting device 100 becomes defective, the bonding layer 120 is removed along with the defective light emitting device 100, and in this case, the upper barrier layer 121b is also removed. However, according to the illustrated exemplary embodiment, the lower barrier layer 121a may be retained on the circuit board 110 unlike the repairing process described above. In this manner, damage to the pads 115 of the circuit board 110 may be prevented by the lower barrier layer 121a.

In addition, according to the illustrated exemplary embodiment, when the lower barrier layer 121a and the upper barrier layer 121b are formed of different metal layers from each other, compositions of the bonding layer formed when the light emitting device 100 are bonded may be different from the bonding layer formed when the light emitting devices 100a for repairing are bonded.

Metal bonding is generally formed by inter-mixing of metallic materials. However, the barrier layer may not be useful for alloy formation, and the temperature for an alloy formation may be high. Since an alloy layer formed already maintains a stable state, using the alloy layer again for metal bonding may be difficult. Hereinafter, a display panel suitable for bonding a light emitting device for repairing and a method of bonding a light emitting device for repairing will be described.

Figure 8:
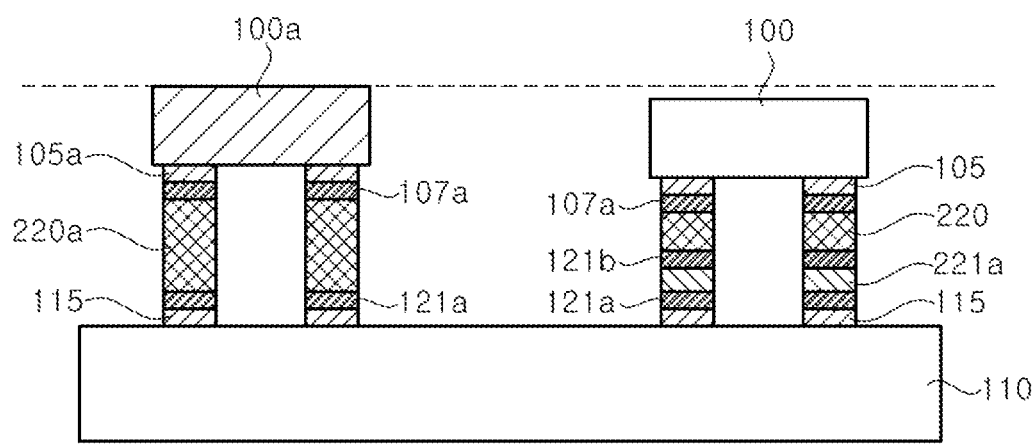
FIG. 8 is a schematic plan view illustrating a display panel according to another exemplary embodiment of the invention.

FIG. 8 is a schematic cross-sectional view taken along line A-A' of a display panel of FIG. 2 according to another exemplary embodiment.

Since the light emitting devices 100 and 100a according to the illustrated exemplary embodiment is substantially similar to those already described above, hereinafter, repeated descriptions of substantially the same elements will be omitted, and differences will be mainly described.

The light emitting device 100 may have pads 105, and the pads 105 may be adhered to corresponding pads 115 of the circuit board 110 through a bonding layer 220. The bonding layer 220 may include, for example, a bonding material, such as Sn, In, or the like. In particular, the bonding layer 220 may be an alloy layer including Au and In.

In an exemplary embodiment, a barrier layer 107a may be disposed between the bonding layer 220 and the pad 105. In another exemplary embodiment, a material of the barrier layer 107 may be mixed with the bonding layer 220 and be dispersed in the bonding layer 220.

A lower barrier layer 121a is disposed between the pad 115 and the bonding layer 220. The lower barrier layer 121a may contact the pad 115. The lower barrier layer 121a may include Ni, Cr, Ti, Ta, Mo, or W.

A lower metal layer 221a may be disposed between the lower barrier layer 121a and the bonding layer 220. The lower metal layer 221a is spaced apart from the bonding layer 220 to maintain its state without being mixed with the bonding layer 220. The lower metal layer 221a may be formed of a metal layer, for example, Au, mixed with a bonding material layer, such as Sn or In. The lower metal layer 221a may contact the lower barrier layer 121a.

An upper barrier layer 121b may be disposed between the lower metal layer 221a and the bonding layer 220. The upper barrier layer 121b may include Ni, Cr, Ti, Ta, Mo, or W. The upper barrier layer 121b may be a metal layer including substantially the same material as the lower barrier layer 121a, but the inventive concepts are not limited thereto. In the illustrated exemplary embodiment, the upper barrier layer 121b may include Ni, Cr, Ti, Ta, Mo, or W suitable for blocking the bonding layer 220. In particular, the upper barrier layer 121b covers the bonding layer 220 to prevent the lower metal layer 221a from being mixed with the bonding layer 220. The upper barrier layer 121b may contact the lower metal layer 221a.

The light emitting device 100a may have pads 105a, and the pads 105a may be adhered to the corresponding pads 115 of the circuit board 110 through the bonding layer 220a. The pads 105a may be formed of the same material as the pads 105 and may have the same layer structure. However, the inventive concepts are not limited thereto, and the pads 105a may be formed of different materials and/or different layer structures from those of the pads 105.

In an exemplary embodiment, an upper surface of the light emitting device 100a may be placed higher than that of the light emitting device 100. In particular, the bonding layer 220a may be thicker than the bonding layer 220, or the pad 105a may be thicker than the pad 105. Furthermore, composition of the bonding layer 220a may be similar to that of the bonding layer 220. In particular, the bonding layer 220a includes a metallic component of the lower metal layer 221a. For example, the bonding layer 220a may be an alloy layer, in which Au and In are mixed. However, in some exemplary embodiments, a content of each component of the bonding layer 220a may be different from that of each component of the bonding layer 220.

A barrier layer 107a may be disposed between the pad 105a and the bonding layer 220a. The barrier layer 107a may be a metal layer including the same material as the barrier layer 107, but the inventive concepts are not limited thereto. In addition, a metallic material of the barrier layer 107a may be mixed with the bonding layer 220a and be dispersed in the bonding layer 220a.

In the illustrated exemplary embodiment, the lower barrier layer 121a may be retained on the circuit board 110 between the pad 115 and the bonding layer 220a. In particular, the lower barrier layer 121a may include Cr, Ti, Ta, Mo, or W. In another exemplary embodiment, the lower barrier layer 121a may be mixed with the bonding layer 220a and be dispersed in the bonding layer 220a. For example, when the lower barrier layer 121a is formed of Ni, Ni may be dispersed in the bonding layer 220a.

According to the illustrated exemplary embodiment, the lower metal layer 221a remains under the light emitting device 100, but the lower metal layer 221a does not remain under the light emitting device 100a. As such, when the light emitting device 100 is removed due to failure in bonding, the lower metal layer 221a may be used to bond the light emitting device 100a for repairing.

FIGS. 9A, 9B, 9C, 9D, and 9E are schematic cross-sectional views illustrating a process of repairing a micro LED according to exemplary embodiments.

Figure 9A:
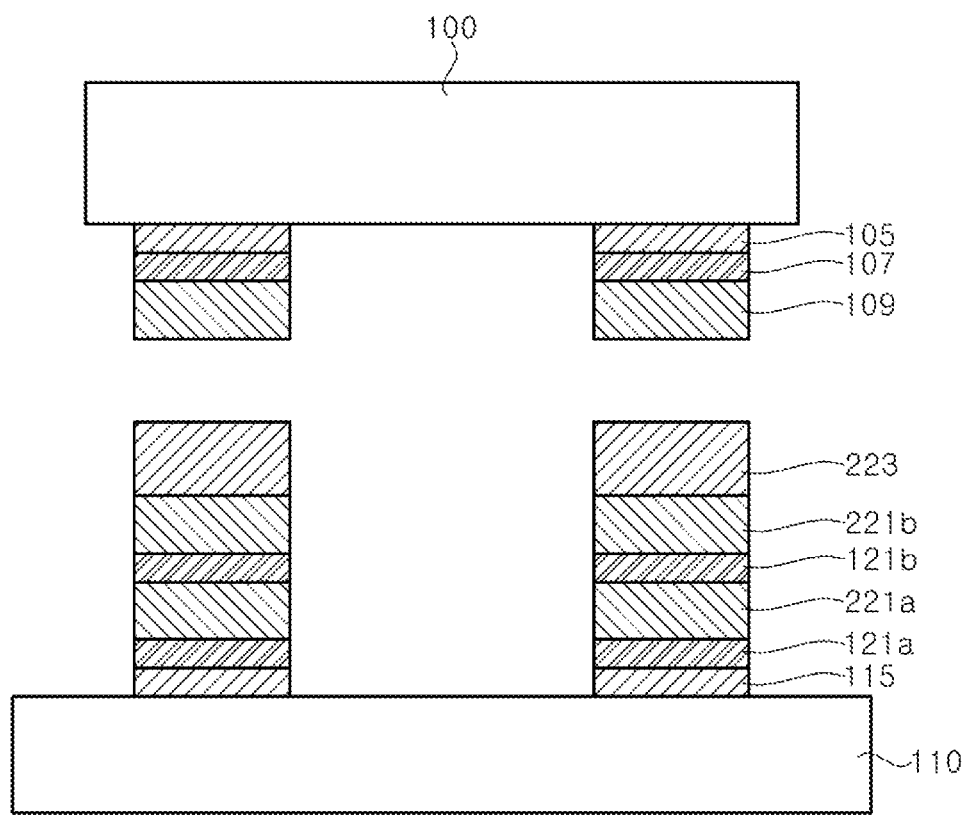
FIGS. 9A, 9B, 9C, 9D, and 9E are schematic cross-sectional views illustrating a process of repairing a micro LED according to exemplary embodiments of the invention.

Referring to FIG. 9A, a circuit board 110 includes pads 115. The pads 115 are connected to circuits in the circuit board 110 and provide contact points for connecting a light emitting device 100 to the circuits. The pads 115 are disposed in each region of the circuit board 110 where the light emitting devices 100 are to be mounted so as to mount a plurality of light emitting devices 100. The pads 115 may be formed of a metal layer including Au. For example, the pads 115 may have a multilayer structure of Cu/Ni/Au.

A lower barrier layer 121a, a lower metal layer 221a, an upper barrier layer 121b, an upper metal layer 221b, and a bonding material layer 223 are provided on the pads 115. The lower barrier layer 121a is disposed between the pad 115 and the lower metal layer 221a.

The lower metal layer 221a is spaced apart from the upper metal layer 221b by the upper barrier layer 121a. The lower metal layer 221a may be formed of the same metal layer as the upper metal layer 221b, for example, an Au layer, but the inventive concepts are not limited thereto. In some exemplary embodiments, the upper metal layer 221b may be formed of a metal layer that is mixed with the bonding material layer 223 to form an alloy during a bonding process.

The bonding material layer 223 is formed of a material that forms a bonding layer by forming an alloy during the bonding process. For example, the bonding material layer 223 may be formed of an In layer. In general, the bonding material layers 223 are provided on the pads 115 for group transfer using micro LED technology.

The upper barrier layer 121b prevents diffusion of a metal component of the bonding material layer 223 into the lower metal layer 221a. The upper barrier layer 121b may include, for example, at least one metal selected from Ni, Cr, Ti, Ta, Mo, and W. For example, the barrier layer 121 may have a multilayer structure of Cr/Ni or Ti/Ni.

The light emitting device 100 has pads 105. The pads 105 correspond to the pads 115 of the circuit board 110. As shown in the drawing, the pads 105 may be bump pads protruding from the light emitting device 100, but do not necessarily have a protruding shape. The plurality of light emitting devices 100 may be placed to correspond to the pads 115 of the circuit board 110.

A barrier layer 107 and a metal layer 109 may be provided on the pads 105. The metal layer 109 may be formed of a metallic material that is to be mixed with the bonding material layer 223 to form an alloy. The barrier layer 107 protects the pad 105 while the bonding material layer 223 and the metal layer 109 form an alloy. The barrier layer 107 may include, for example, at least one metal selected from Ni, Cr, Ti, Ta, Mo, and W.

Figure 9B:
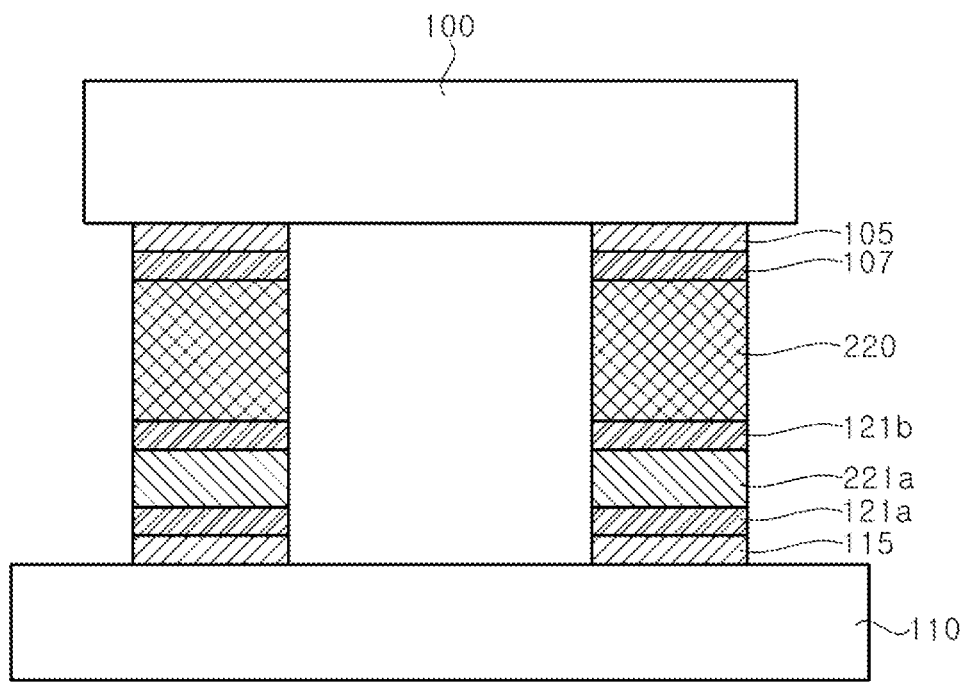

Referring to FIG. 9B, after the metal layers 109 of the light emitting device 100 are arranged on the bonding material layer 223 of FIG. 9A, a bonding layer 220 is formed by applying heat at a bonding temperature. The upper metal layer 221b, the bonding material layer 223, and the metal layer 109 may be mixed to form the bonding layer 220 as an alloy. As such, the bonding layer 220 may include a metal component of the bonding material layer 223, a metal component of the upper metal layer 221b, and a metal component of the metal layer 109. To form a favorable bonding layer 220, a thickness of the bonding material layer 223 and thicknesses of the upper metal layer 221b and the metal layer 109 may be controlled at an appropriate ratio.

According to the illustrated exemplary embodiment, the bonding layer 220 is formed between the upper barrier layer 121b and the barrier layer 107. In this manner, the light emitting device 100 may be stably attached to the circuit board 110 by the bonding layer 120. The upper barrier layer 121b prevents a metallic material of the bonding layer 220 from diffusing into the lower metal layer 221a to prevent the lower metal layer 221a included in the alloy. However, in some exemplary embodiments, at least a portion of the upper barrier layer 121b may be mixed in the bonding layer 220 and dispersed therein.

The barrier layer 107 may protect the pad 105 by blocking diffusion of the metallic material of the bonding layer 220 to the pad 105. However, in some exemplary embodiments, at least a portion of the barrier layer 107 may be mixed in the bonding layer 220 and dispersed therein.

Figure 9C:
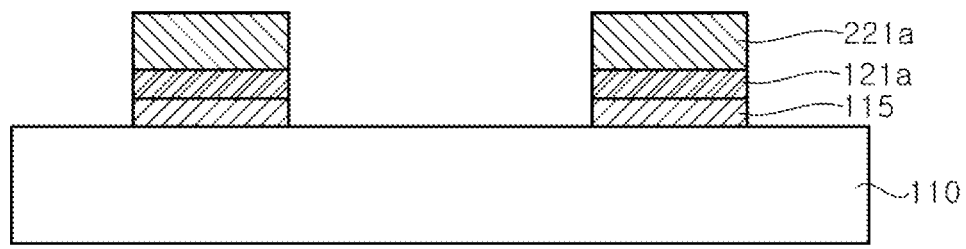

Referring to FIG. 9C, as described above with reference to FIG. 9B, after the light emitting device 100 is bonded to the circuit board 110, a defect of the light emitting device 100 may be detected. The defect of the light emitting device 100 may be caused by, for example, defective bonding, or by a failure in performance of the light emitting device 100.

In this case, the defective light emitting devices 100 are removed from the circuit board 110. When the light emitting devices 100 are removed, the remaining bonding layers 220 as well as the barrier layers 121b may be removed. For example, the bonding layers 220 and the barrier layers 121b may be removed using a laser, for example. Accordingly, the lower metal layers 221a may be retained on upper portions of the pads 115 of the circuit board 110 after the light emitting devices 100 are removed.

Figure 9D:
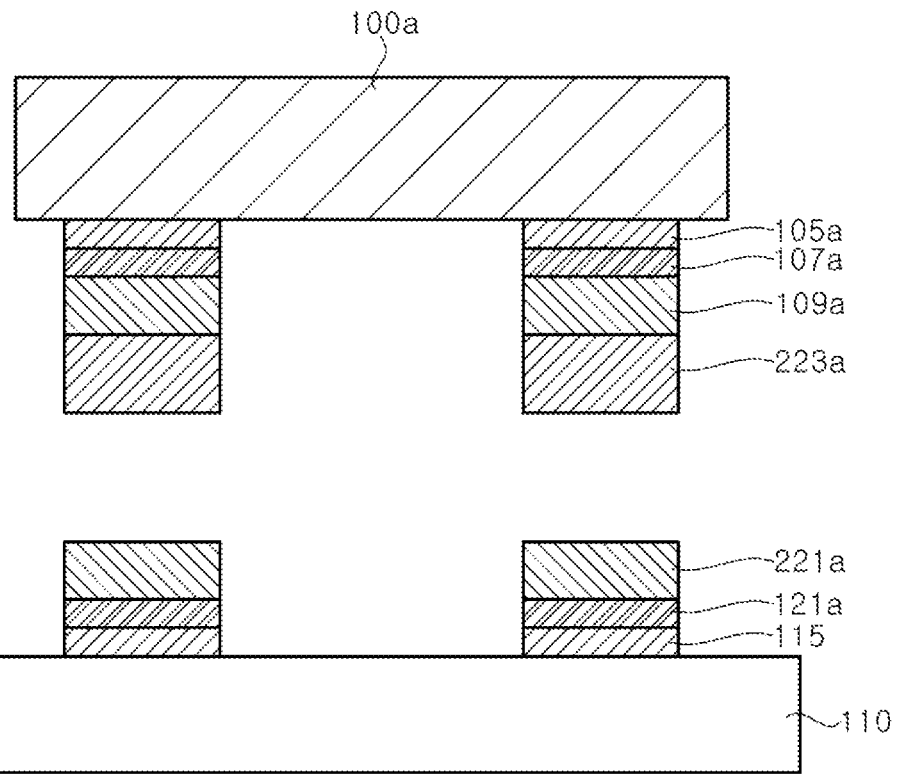

Referring to FIG. 9D, a light emitting device 100a for repairing is provided on the pads 115. The light emitting device 100a for repairing replaces the defective light emitting device 100, and may have performance required as the light emitting device 100. The light emitting device 100a may have substantially the same structure as the light emitting device 100, but the inventive concepts are not limited thereto.

The light emitting device 100a may have pads 105a. The pads 105a may have the same material and layer structure as those of the pads 105 described above, but the inventive concepts are not limited thereto.

A barrier layer 107a, a metal layer 109a, and a bonding material layer 223a are provided on the pads 105a. The barrier layer 107a is provided to protect the pad 105a, and the metal layer 109a is provided together with the bonding material layer 223a to form a bonding layer.

The bonding material layer 223a may include a bonding material, such as Sn or In. In an exemplary embodiment, the bonding material layer 223a has a melting point equal to or lower than that of the bonding material layer 223 described above.

Figure 9E:
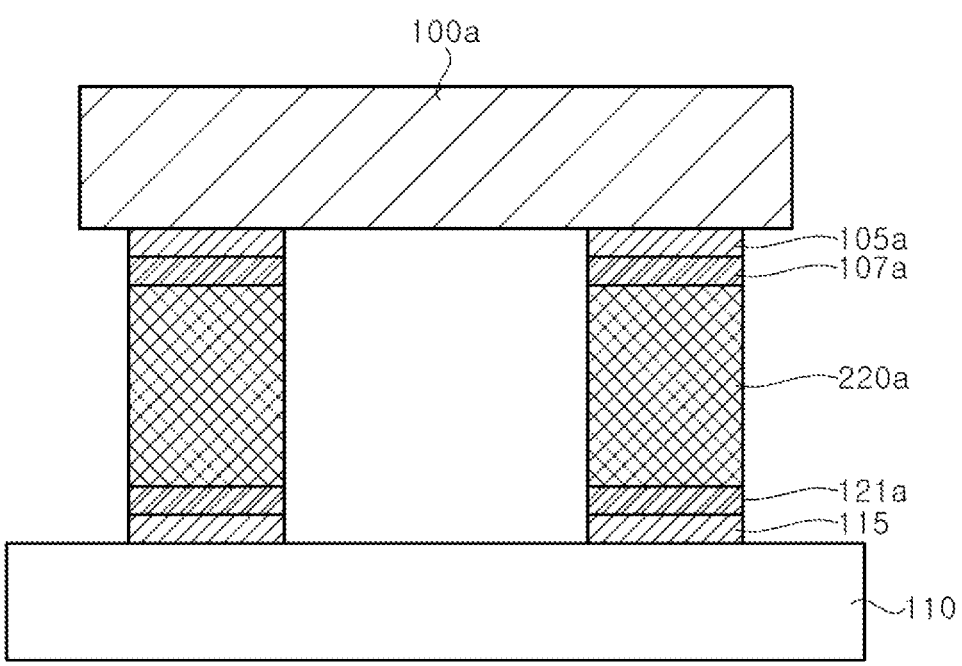

Referring to FIG. 9E, after the bonding material layers 223a are arranged on the corresponding pads 115, bonding layers 220a are formed by applying heat at a bonding temperature. In this manner, the light emitting device 100a is bonded to the circuit board 110 by the bonding layer 220a.

The bonding layer 220a may be formed by mixing the metal layer 109a, the lower metal layer 221a, and the bonding material layer 223a. Further, at least a portion of a metallic material of the lower barrier layer 121a or the barrier layer 107a may be mixed in the bonding layer 220a. The bonding layer 220a may have the same composition as the bonding layer 220, but may have composition different from that of the bonding layer 220 in some exemplary embodiments.

A method of bonding the light emitting device 100a for repairing is substantially similar to the method described above with reference to FIGS. 5A to 5E or FIGS. 6A to 6E, and thus, repeated detailed descriptions thereof will be omitted to avoid redundancy.

According to illustrated exemplary embodiment, the lower metal layer 221a and the upper metal layer 221b are provided on the pad 115, and the lower metal layer 221a may be used to bond the light emitting device 100a for repairing, thereby improving adherence of the light emitting device 100a for repairing.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
   a circuit board having first pads;
   a plurality of light emitting devices disposed on the circuit board and having second pads, at least one of the light emitting devices including a repaired light emitting device configured to emit light having a first color; and
   a metal bonding layer bonding the first pads and the second pads,
   wherein the metal bonding layer of the repaired light emitting device has thickness different from that of the metal bonding layer of the remaining light emitting devices which are configured to emit light having the first color, and
   wherein an upper surface of the remaining light devices are disposed at an elevation between an upper surface and a bottom surface of the repaired light emitting device.

2. The display panel of claim 1, wherein an upper surface of the repaired light emitting device is disposed at a higher elevation than those of the remaining light emitting devices.

3. The display panel of claim 1, wherein the metal bonding layer includes at least one of AuSn, CuSn, and In.

4. The display panel of claim 1, wherein each of the light emitting devices is configured to emit at least one of blue light, green light, and red light.

5. The display panel of claim 1, wherein each of the light emitting devices is configured to emit each of blue light, green light, and red light.

6. A display panel, comprising:
   a circuit board having first pads;
   a plurality of first light emitting devices disposed on the circuit board and configured to emit light having a first color;
   a first metal bonding layer bonding the first light emitting device to the first pad;
   a first lower barrier layer disposed between the first metal bonding layer and the first pad; and
   a lower metal layer disposed between the first lower barrier layer and the first metal bonding layer; and at least one second light emitting device disposed on the circuit board and configured to emit light having the first color, wherein the first metal bonding layer includes an alloy, and the lower metal layer includes a metal layer having a different component from the first metal bonding layer, and wherein an upper surface of the first light emitting devices are disposed at an elevation between an upper surface and a bottom surface of the at least one second light emitting device.

7. The display panel of claim 6, wherein:
the first metal bonding layer includes Au and In; and
the lower metal layer includes Au.

8. The display panel of claim 6, wherein the lower metal layer contacts the first lower barrier layer.

9. The display panel of claim 6, further comprising an upper barrier layer disposed between the first metal bonding layer and the lower metal layer.

10. The display panel of claim 9, wherein the upper barrier layer contacts the first metal bonding layer and the lower metal layer.

11. The display panel of claim 6, wherein:
the first light emitting device includes second pads;
the display panel further includes a third barrier layer disposed on the second pad; and
the first metal bonding layer is disposed between the lower metal layer and the third barrier layer.

12. The display panel of claim 6, further comprising
a second metal bonding layer bonding the second light emitting device to the first pad; and,
wherein the second metal bonding layer includes a metallic element of the lower metal layer.

13. The display panel of claim 12, further comprising a second lower barrier layer disposed between the second metal bonding layer and the first pad,
wherein the second lower barrier layer contacts the first pad and the second metal bonding layer.

14. The display panel of claim 13, further comprising an upper barrier layer disposed between the first metal bonding layer and the lower metal layer,
wherein the upper barrier layer contacts the first metal bonding layer.

15. The display panel of claim 12, wherein the second metal bonding layer is thicker than the first metal bonding layer.

16. The display panel of claim 12, wherein an upper surface of the second light emitting device is disposed at a higher elevation than that of the first light emitting device.

17. The display panel of claim 12, wherein the first and second light emitting devices are configured to emit at least one of blue light, green light, and red light, respectively.

18. The display panel of claim 12, wherein the first and second light emitting devices are configured to emit each of blue light, green light, and red light, respectively.

* * * * *